United States Patent
Sugaya et al.

(10) Patent No.: US 6,696,139 B2
(45) Date of Patent: Feb. 24, 2004

(54) GREEN SHEET AND MANUFACTURING METHOD THEREOF, MANUFACTURING METHOD OF MULTI-LAYER WIRING BOARD AND MANUFACTURING METHOD OF DOUBLE-SIDED WIRING BOARD

(75) Inventors: Yasuhiro Sugaya, Osaka (JP); Osamu Inoue, Osaka (JP); Junichi Kato, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/330,159

(22) Filed: Dec. 30, 2002

(65) Prior Publication Data
US 2003/0141006 A1 Jul. 31, 2003

Related U.S. Application Data

(62) Division of application No. 09/492,781, filed on Jan. 27, 2000, now Pat. No. 6,521,069.

(30) Foreign Application Priority Data

Jan. 27, 1999 (JP) ............................................ P11-18333
Jan. 18, 2000 (JP) ......................................... P2000-9073

(51) Int. Cl.$^7$ ................................................. B32B 3/00
(52) U.S. Cl. ....................................... 428/210; 428/209
(58) Field of Search ................................ 428/209, 210

(56) References Cited

U.S. PATENT DOCUMENTS

| 3,953,562 A | | 4/1976 | Hait et al. |
| 4,753,694 A | | 6/1988 | Herron et al. |
| 4,836,966 A | | 6/1989 | Shimuzu et al. |
| 5,021,287 A | * | 6/1991 | Otagiri et al. ............. 428/212 |

(List continued on next page.)

FOREIGN PATENT DOCUMENTS

| JP | 64-42809 | 2/1989 |
| JP | 1-120802 | 5/1989 |
| JP | 1-239994 | 9/1989 |
| JP | 2-16795 | 1/1990 |
| JP | 4-202074 | 7/1992 |
| JP | 5-90734 | 4/1993 |
| JP | 5-315754 | 11/1993 |
| JP | 6-61647 | 3/1994 |
| JP | 9-142941 | 6/1997 |
| JP | 2785544 | 5/1998 |
| JP | 10-242644 | 9/1998 |

OTHER PUBLICATIONS

"Principles of Polymerization," George Odian, John Wiley & Sons, Second Edition, 1981, p. 294–296.
IBM Technical Disclosure Bulletin, "High Density MLC Structure," vol. 32, No. 4B, p. 354, Sep. 1, 1989.
IBM Technical Disclosure Bulletin, "Fabrication of Printed Circuits without Undercutting of Conductive Lines," vol. 9, No. 10, p. 1258–1259, Mar. 1, 1967.
IBM Technical Disclosure Bulletin, "Decal Fabrication for Fine Line Transfer to Green Sheets," vol. 35, No. 7, p. 445–446, Dec. 1, 1992.

Primary Examiner—Cathy Lam
(74) Attorney, Agent, or Firm—McDermott, Will & Emery

(57) ABSTRACT

A green sheet including a binder containing an acrylic resin having no polar group and a ceramics material in powder is prepared, and connection via are formed in the green sheet. Further, a conductor layer having virtually no voids is placed on the green sheet and a mask is also placed on the conductor layer. Then, the conductor layer is patterned by wet-etching so that wiring is formed thereon. A plurality of the green sheets thus formed are laminated, and a binding sheet, which contains an inorganic composition that has virtually no sintering shrinkage at the firing temperature of the multi-layered body as a main component, is formed on either both surfaces or one surface of the laminated body, and this is then fired, and thereafter, the binding sheet is removed.

8 Claims, 5 Drawing Sheets

U.S. PATENT DOCUMENTS

| | | |
|---|---|---|
| 5,057,360 A | 10/1991 | Osaka et al. |
| 5,085,720 A | 2/1992 | Mikeska et al. |
| 5,229,213 A | 7/1993 | Horiuchi et al. |
| 5,248,712 A | 9/1993 | Takeuchi et al. |
| 5,370,759 A | 12/1994 | Hakotani et al. |
| 5,387,474 A | 2/1995 | Mikeska et al. |
| 5,456,778 A | 10/1995 | Fukuta et al. |
| 5,925,444 A | 7/1999 | Katsumura et al. |
| 6,001,761 A | 12/1999 | Hata et al. |
| 6,042,667 A | 3/2000 | Adachi et al. |
| 6,413,620 B1 * | 7/2002 | Kimura et al. .............. 428/210 |

\* cited by examiner

F I G. 1
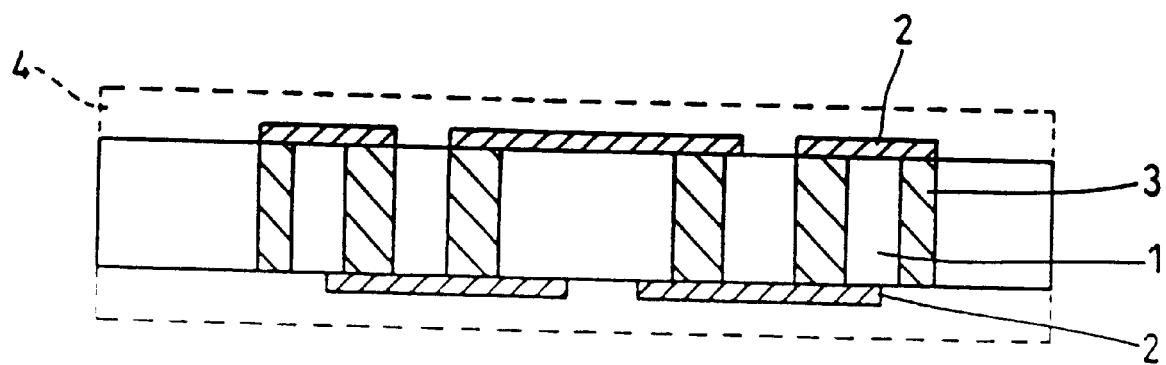

F I G. 4
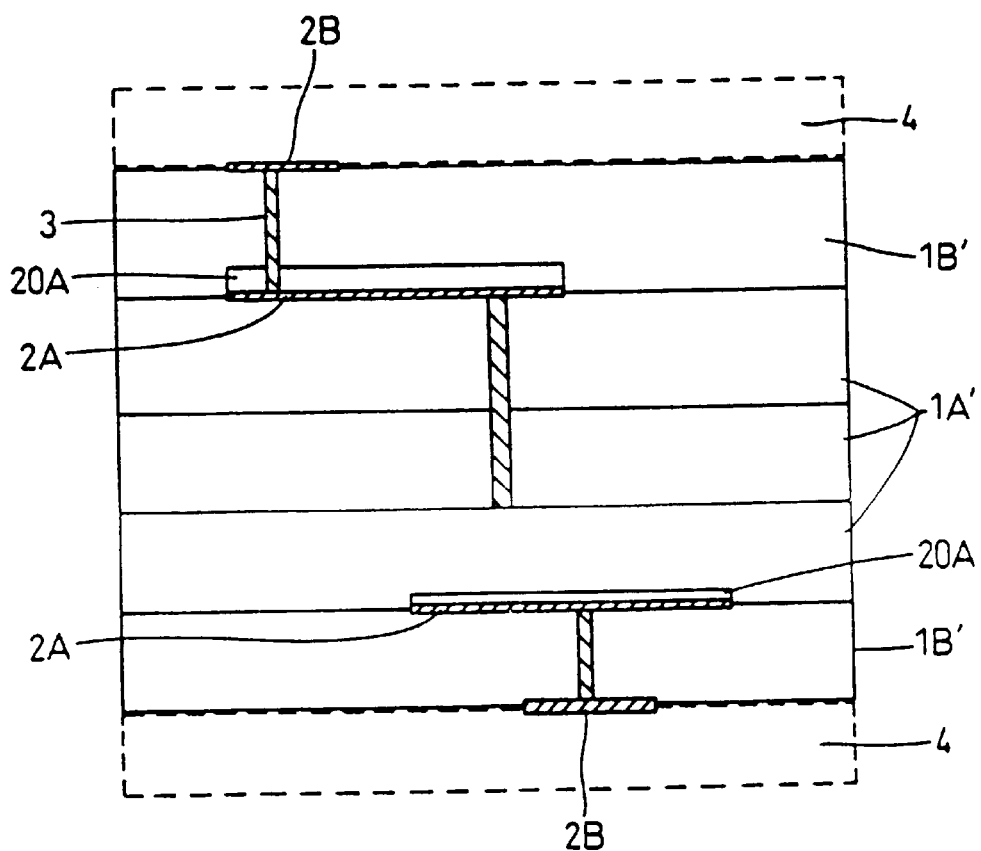

GREEN SHEET AND MANUFACTURING METHOD THEREOF, MANUFACTURING METHOD OF MULTI-LAYER WIRING BOARD AND MANUFACTURING METHOD OF DOUBLE-SIDED WIRING BOARD This application is a divisional of application Ser. No. 09/492,781 filed Jan. 27, 2000.

BACKGROUND OF THE INVENTION

1. Field of the Invention

The present invention relates to a manufacturing method of multi-layer printed boards and double-sided printed boards used for hybrid ICs, multi-chip modules, chip-size packages, etc., and also concerns green sheets suitable for manufacturing the multi-layer printed boards and double-sided printed boards, and the manufacturing method of the green sheets.

2. Description of the Related Art

In recent years, the development of low-temperature sintered glass multi-layer printed boards has made it possible to use low-melting-point metals (such as gold, silver, copper, silver-palladium and mixtures thereof) having small wiring resistivities as conductor materials for multi-layer printed boards.

However, in these multi-layer printed boards, a green sheet (having ceramics and an organic binder as its main components), which is normally used as the board material, is subjected to a volume shrinkage of 10 to 20% by the firing process, and during the firing process, the shrinkage does not necessarily take place uniformly in respective directions. This results in a reduction in the dimensional precision, thereby causing degradation in the yield.

Such irregularities in the rate of the volume shrinkage can be reduced, for example, by the following method as disclosed in Japanese Laid-Open Patent Application No. 257553/1991 (Tokukaihei 03-257553). In this method, sintering resistant green sheets are stacked on the surface and the rear surface of a green sheet, and this laminated body is fired so that shrinkage occurs only in the thickness direction without virtually any shrinkage on the X-Y plane; thus, the above-mentioned irregularities can be reduced.

The application of such a non-shrinkage manufacturing process makes it possible to reduce irregularities in the rate of volume shrinkage and also to simultaneously fire the green sheet and the conductor wiring such as metal foil wiring.

In the non-shrinkage sintering method, in most cases, conductor paste is printed and formed into the shape of a wiring pattern, and this is simultaneously fired as the green sheet is fired so that the wiring is formed.

However, when the formation method of the wiring using the conductor paste is applied to the non-shrinkage sintering method, the following problem arises: The laminated green sheet that has no shrinkage in the X-Y direction prevents the sintering of the conductor paste, resulting in a high value in the conductor resistivity of the wiring.

In order to solve such a problem, metal foil is used as the wiring, and after the wiring of the metal foil has been formed on a green sheet, the green sheet is subjected to a laminating process, and then fired.

With respect to the method for forming the metal foil wiring on a green sheet, for example, Japanese Laid-Open Patent Application No. 242644/1998 (Tokukaihei 10-242644) has disclosed a transferring method using a thermal separation sheet. Here, in this transferring method, patterning is made by carrying out a wet etching process on metal foil affixed to the thermal separation sheet; however, since the thermal separation sheet lacks resistance to an etchant used for the wet etching, it is virtually difficult to form the pattern on the green sheet by using the transferring method.

In order to solve this problem, the applicant of the present invention has devised a method in which wiring is formed by directly forming a metal foil pattern on a green sheet by means of a subtractive method in which the wet etching method is used. However, although it enables the formation of the metal foil pattern, the wet etching method has a problem in which the etchant used in the patterning process gives damages to the green sheet, preventing the green sheet from being finely fired.

SUMMARY OF THE INVENTION

Therefore, an object of the present invention is to provide a green sheet having an etching resistant property.

Another object of the present invention is to provide a multi-layer wiring board having a low wiring resistivity without causing any problems in its manufacturing process.

In order to achieve the above-mentioned objects, the present invention provides a green sheet which mainly contains a ceramics material in powder and a binder, the binder containing an acrylic resin having no polar group.

First the present invention provides a green sheet containing a ceramics material in powder and a binder, wherein the binder contains an acrylic resin having no polar group.

Secondly the present invention provides a manufacturing method for a green sheet comprising the steps of: manufacturing a green sheet including the binder containing the acrylic resin having no polar group and the ceramics material in powder; and after having placed a conductor layer on the green sheet and then a mask on the conductor layer, forming a wiring pattern by patterning the conductor layer by wet-etching Thirdly the present invention provides a manufacturing method for a multi-layer wiring board comprising the steps of: manufacturing a green sheet including the binder containing the acrylic resin having no polar group and the ceramics material in powder; forming an interlayer connecting via through the green sheet in the width direction; after having placed a conductor layer having virtually no voids on the green sheet and then a mask on the conductor layer, patterning the conductor layer by wet-etching; laminating a plurality of the green sheets; after having placed on either both sides or one side of the green sheet multi-layered body thus manufactured a binding sheet containing an inorganic composition that has virtually no sintering shrinkage at the firing temperature of the green sheet multi-layered body as a main component, allowing the resulting multi-layered body to undergo a firing process and then removing the binding sheet therefrom.

Fourthly the present invention provides a manufacturing method for a double-sided wiring board comprising the steps of: manufacturing a green sheet including the binder containing the acrylic resin having no polar group and the ceramics material in powder; forming an interlayer connecting via through the green sheet in the width direction; after having placed a conductor layer having virtually no voids on the green sheet and then a mask on the conductor layer, patterning the conductor layer by wet-etching; after having placed on either both sides or one side of the green sheet a binding sheet-containing an inorganic composition that has virtually no sintering shrinkage at the firing temperature of the green sheet as a main component, allowing the resulting green sheet to undergo a firing process and then removing the binding sheet therefrom.

With the above-mentioned arrangement of the present invention, a preferable water resistant property is provided by the acrylic resin having no polar group that is contained therein; therefore, even if the subtractive method in which the green sheet is immersed in an etchant together with the conductor so as to form a wiring pattern is adopted, no damage is caused in the green sheet. Thus, it becomes possible to positively form a wiring pattern made of metal foil on the green sheet.

Moreover, in the case when the conductor layer made of a conductor having virtually no voids is placed on the surface of the sheet, it is not necessary to apply a binder-eliminating process to the conductor layer. This makes it possible to prevent the generation of bubbles that would otherwise be caused by the binder-eliminating process, and also to prevent shrinkage in the X-Y direction; therefore, the pattern (wiring pattern) of the conductor layer, formed on the green sheet, can be maintained as it is. As a result, it becomes possible to provide wiring having a low resistivity that would not be achieved by wiring that uses conductor paste.

The binder preferably contains a methacrylic-acid-based acrylic resin as a main component. With this arrangement, since the binder is made from a methacrylic-acid-based acrylic resin as its main component, a better thermal decomposing property is provided so that it is possible to carry out a binder-eliminating process in a non-oxidizing atmosphere. Thus, it becomes possible to realize a simultaneous firing process together with, for example, copper conductor wiring.

Moreover, the binder may preferably contain the acrylic resin having no polar group at a weight rate of not less than 10% in its blending ratio. This arrangement allows the binder to exert a better water resistant property so that it can sufficiently withstand the immersing process to an etchant.

The above-mentioned binder may also contain the acrylic resin having no polar group at a weight rate of not more than 50% in its blending ratio. This arrangement allows the binder to exert sufficient sheet strength as a base material.

Moreover, the conductor layer is preferably made of metal foil. This arrangement makes it possible to form a conductor layer having virtually no voids more easily.

With respect to the above-mentioned conductor layer, the metal foil is preferably subjected to a roughening process on its surface. This arrangement makes it possible to further strengthen the joining between the conductor layer and the green sheet.

Moreover, it is preferable to place on the conductor layer a mask containing an inorganic composition that has virtually no sintering shrinkage at the firing temperature of the green sheet as its main component. With this arrangement, the mask containing the inorganic composition as its main component can be easily removed after the firing process; therefore, it becomes possible to simplify the mask separation process that is carried out after the formation of wiring through a patterning process on the conductor layer by means of etching. In the case when this green sheet is used for forming a double-sided or a multi-layer wiring board, the effectiveness of such an advantage can be realized when forming the wiring on the double-sided wiring board or on the outermost layer of the multi-layer wiring board.

With respect to the etchant used in the wet-etching, it is preferable to use a water solution of ferric chloride; thus, in the case of the conductor layer made of copper, it becomes possible to form a pattern at high speeds without causing any damages to the green sheet.

With respect to the mask, it is preferable to use virtually the same material as that of the binding sheet. This arrangement makes it possible to simultaneously remove the mask formed as the uppermost layer at the time of removing the binding sheet. Consequently, it is possible to reduce the number of processes by eliminating the removing process for the mask as the uppermost film.

With respect to the inorganic composition contained in the binding sheet and the mask, $Al_2O_3$ is preferably used.

BRIEF DESCRIPTION OF THE DRAWINGS

These and other objects, features and advantages of the present invention will become apparent upon consideration of the following detailed description of the invention when read in conjunction with the drawing figures in which:

FIG. 1 is a cross-sectional view that shows the construction of a double-sided wiring board of a first preferred embodiment in accordance with the present invention;

FIG. 4 is a cross-sectional view that shows the construction of a multi-layer wiring board of a fourth preferred embodiment in accordance with the present invention;

DETAILED DESCRIPTION OF THE INVENTION

Figure 2A:
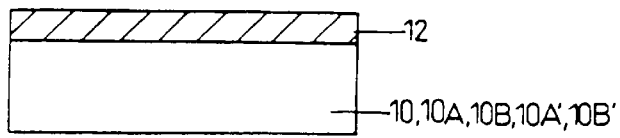
FIGS. 2A–2D are cross-sectional views that show the constructions of multi-layer wiring boards of second and third preferred embodiments in accordance with the present invention.
Figure 2A:

Referring to Figures, the following description will discuss preferred embodiments of the present invention:

(First Embodiment)

FIG. 1 is a schematic cross-sectional view that shows a double-sided wiring board in the first preferred embodiment of the present invention. As illustrated in FIG. 1, the double-sided wiring board of the present embodiment is provided with a substrate layer 1, wires 2 that are placed on both sides of the substrate layer 1, and a connection via 3 for electrically connecting the wires 2. Here, reference numeral 4 represents a binding sheet that is placed on the outside of the substrate layer 1 only in a manufacturing process which will be described later.

The substrate layer 1 contains ceramics that includes glass ceramics, as its main component. The wires 2, which have a rate of voids of not more than 1%, is made from a conductor having virtually no voids. More specifically, the wires 2 are constituted by metal foil. The binding sheet 4 is a sheet which contains an inorganic composition that has virtually no sintering shrinkage at the firing temperature of the substrate layer 1 as its main component, and prior to the firing process of the double-sided wiring board, the sheet is stacked on either both sides or one side of the green sheet of the double-sided wiring board in a laminating manner; however, after completion of the firing process, the sheet is entirely removed. The binding sheet 4 is preferably made of $Al_2O_3$.

Next, an explanation will be given of a manufacturing method for the double-sided wiring board of the present embodiment.

First, with respect to materials for the substrate layer 1, a green sheet 10 that is to form the substrate layer 1 and conductor paste (hereinafter, referred to as via paste) used for the connection via 3 are prepared. In this case, ceramics collectively represent inorganic insulating materials including glass ceramics.

The green sheet 10 is manufactured as follows: After sufficiently mixing and kneading inorganic powder and an organic binder so as to form a slurry, the resulting slurry is formed into a sheet shape by means of a doctor blade method, etc. This slurry sheet is formed on a base film made from a material such as polyethylene resin, polyester resin and paper. The slurry sheet thus formed is dried to form a green sheet 10.

The ceramics material forming the green sheet 10 is not particularly limited, and preferably selected by taking into consideration factors such as heat radiating property, strength, sintering temperatures and costs; and alumina that is widely used in general, glass ceramics and Bi—Ca—Nb—O materials, which are ceramics materials that are sintered at temperatures lower than the fusing point of the wiring metal, may be used. In particular, glass ceramics is preferably used, since it has a low firing temperature of approximately 900° C., and since it can be used together with a wiring material, such as Ag and Cu, having a low resistivity and a low melting point.

With respect to ceramics components used in the glass ceramics, alumina, silica, mullite, forsterite, etc. are listed. With respect to glass components used in the glass ceramics, either those of crystallized glass or those of non-crystallized glass may be adopted. Examples of those of crystallized glass include borosilicate glass and lead borosilicate glass. Examples of those of non-crystallized glass include glasses of borosilicate such as those of lead borosilicate and calcium borosilicate. Examples of glasses of borosilicate include silicate glass and alumino silicate glass.

In the case of the application of a base metal as the wiring material, it is preferable to use an acrylic resin material having a low thermal decomposing temperature as the organic binder to be added to the green sheet 10. The reason for this is explained as follows:

Here, an acrylic resin binder is used as the organic binder. In general, with respect to the organic binder, resins of the ethylcellulose group, the polyvinylalcohol (PVA) group and the polyvinylbutyral (PVB) group may be used, and since these resins have comparatively high thermal decomposing temperatures, they can be used without causing any problems in the case when silver, which is less susceptible to oxidation, is used as the wiring material. However, in the case when a base metal such as copper, which is susceptible to oxidation, is used as the wiring material, and in the case when ceramics such as glass ceramics, which have low firing temperatures, are used as the material for the green sheet, these resins are not suitable for the organic binder; therefore, an acrylic resin binder is more preferably used. In the present embodiment, since copper foil is used as the wiring material, an acrylic resin binder is used.

Moreover, among acrylic resin binders, an organic binder containing a methacrylic-acid-based acrylic resin as its main component is adopted. The methacrylic-acid-based acrylic resin allows the monomer decomposition to easily progress at low temperatures, and therefore is preferably used so as to carry out a binder-eliminating process in an inert gas atmosphere. More specifically, a methacrylic-acid-based acrylic resin binder having an average molecular weight in the range of not less than $2.0 \times 10^5$ to not more than $5.0 \times 10^5$ is preferably used. This is because the molecular weight of less than $2.0 \times 10^5$ fails to provide sufficient sheet strength and sheet processing property, and because the molecular weight exceeding $5.0 \times 10^5$ causes a reduction in the dissolving property to a solvent, resulting in deterioration in the binder-eliminating property. Based upon these facts, an organic binder containing a methacrylic-acid-based acrylic resin as its main component is used in the present embodiment.

Moreover, in order to improve the sheet strength and the dispersing property of ceramics powder, a polar group, such as a COOH group (carboxylic group) and an OH group (hydroxyl group), is added to the acrylic resin constituting the organic binder. In general, the above-mentioned methacylic-acid-based acrylic resin is an acrylic resin having a polar group. However, when a polar group is added to the acrylic resin, the water resistant property of the organic binder is impaired. The water resistant property of the binder relates to the rate of content of the acrylic resin having the polar base in the binder, and the higher the rate of content, the worse the water resistant property.

In the normal manufacturing process of a wiring board, the water resistant property and chemical resistant property in the green sheet are seldom required; however, in the wet-etching process of the manufacturing process used in the present invention, lack of the water resistant property raises serious problems, as will be described later. For this reason, in order to simultaneously satisfy the sheet strength, the dispersing property of ceramics powder and the water resistant property, a binder material, which contains a methacrylic-acid-based acrylic resin as its main component with the acrylic resin having no polar group, is preferably used as the organic binder to be contained in the green sheet 10, and in the present embodiment, such a resin is used as the binder.

With respect to the acrylic resin having no polar group, an acrylic binder, etc. having polyalkylmethacrylate as its component are listed. In contrast, with respect to the acrylic resin having a polar group, a methacylic-acid-based acrylic resin is preferably used from the viewpoint of a preferable binder-eliminating property in an inert atmosphere.

Here, in order to prevent the thermal decomposing property of the organic binder as a whole from being impaired, it is preferable to set the molecular weight of the acrylic resin having no polar group to a comparatively low molecular weight (approximately $1 \times 10^5$). Moreover, the blending ratio of the acrylic resin having no polar group with respect to the organic binder as a whole is preferably set to have a weight ratio from not less than 10% to not more than 50%. The ratio less than 10% fails to sufficiently improve the water resistant property, and the ratio exceeding 50% causes degradation in the dispersing property of ceramics powder, resulting in a reduction in the sheet strength.

The specific method for manufacturing the green sheet 10 is not particularly limited to the doctor blade method; and other methods, such as a calender method and a roll coater method, may be adopted.

The green sheet 10 thus manufactured is subjected to a machining process so as to provide a hole, which is filled with a connection via 3. With respect to the machining process for the hole, for example, a punching process and a drilling process may be adopted. Then, conductor paste used for the connection via (hereinafter, referred to as via paste) is injected into the via hole machined in the green sheet 10; thus, the connection via 3 is formed.

The via paste is prepared by sufficiently mixing and kneading metal powder and inorganic powder to be used therein and an organic vehicle made of an organic binder and a solvent. Here, the composition of this organic binder is the same as the organic binder used for the above-mentioned green sheet 10. With respect to the solvent forming the organic vehicle, alcohols such as terpineol and ketones may be used. Moreover, a plasticizer and a surfactant maybe added thereto, if necessary. Furthermore, the kneading method of the via paste is not particularly limited; and, for example, a roll mill with three rolls, a ball mill, etc. may be used.

Next, wires 2, each containing a conductor having virtually no voids as its main component, are formed on both sides of the green sheet 10. In this case, with respect to the conductor, an example thereof includes a metal conductor that is a solid substance having a rate of voids of not more than 1%, and more specifically, examples thereof include metal foil, and from the viewpoint of a metal having a low-melting point with a small wiring resistivity as well as from the economic viewpoint, copper foil is preferably used. The sintered body obtained by firing metal powder paste, basically, is not included in the conductor as described here, except those finely solidified to 100%.

The metal conductor used for the wires 2 and the metal component of the above-mentioned via paste are not particularly limited; and are appropriately selected depending on the metal component of the wires and the manufacturing method and the application state of the substrate. For example, Cu, Ag, Au, Pd, Pt, Ni and alloys thereof are preferably used, and in particular, Ag and Cu, which have low resistivities, are more preferably used.

The wires 2 are directly formed on both sides of the green sheet 10. One manufacturing method for the wires 2 is described as follows: That is, as illustrated in FIG. 2(a), a metal conductor layer 2 is placed on the green sheet 10. With respect to the metal conductor layer 12, not particularly limited, a metal conductor layer 12 manufactured by a thin-film process, such as, for example, a vapor deposition method and a sputtering method, may be used; and in particular, metal foil, such as copper foil, is preferably used from the viewpoint of simple process and costs.

Figure 2B:
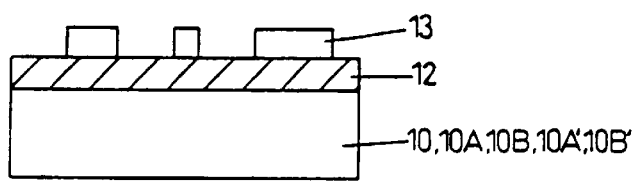
Figure 2B:

Moreover, as illustrated in FIG. 2(b), a mask 13 is formed on the metal conductor layer 12. The mask 13 is made of virtually the same material as that of the binding sheet 4; in other words, it is made of a resin component and a material containing an inorganic composition (more specifically, for example, $Al_2O_3$) that has virtually no sintering shrinkage at the time of the firing process of the green sheet 10 as its main component.

Figure 2C:
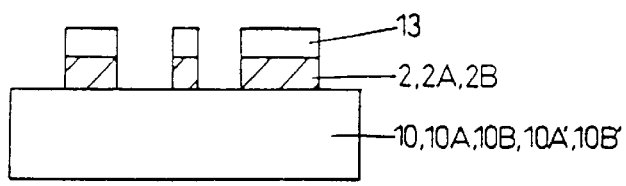
Figure 2C:
Figure 2D:
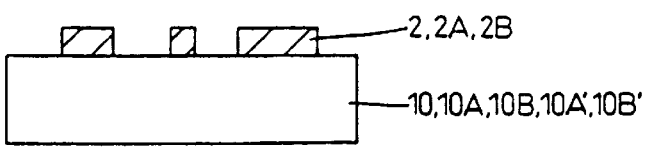

As illustrated in FIG. 2(c), after the mask 13 has been formed thereon, the green sheet 10 is immersed in an etchant so as to pattern the wires 2, and after having been sufficiently washed by water, this is dried.

Here, in the case of the wires 2 formed on the green sheet 10 that is used to form a double-sided wiring board, the mask 13 is allowed to remain without being removed even after the formation of the wires 2. This forms one of the features of the present embodiment; and the reason for allowing the mask 13 to remain will be described later.

In the case when the metal conductor layer 12 is made of metal foil, in order to make the metal conductor layer 12 more firmly contact the green sheet 10, it is preferable to apply a roughening process to the surface of the metal conductor layer 12. Moreover, the metal conductor layer 12 and the green sheet 10 are preferably thermally press-bonded to each other. In order to allow the organic binder inside the green sheet 10, that is, for example, an acrylic resin binder, to exert its adhering force to a maximum degree, the bonding process needs to be carried out not at room temperature, but at an appropriate temperature, for example, at not less than 80° C.; and this heating process and the roughening process on the surface of the metal conductor layer are combinedly carried out so that the mutual bonded state can be strengthened.

Furthermore, in order to improve the bonded state between the green sheet 10 and the metal conductor layer 12 made of metal foil, a green sheet 10 may be formed on the metal conductor layer 12 (in which no roughening process is required) by means of the casting method. The way in which the casting method is carried out is not particularly limited; and the doctor blade method, the roll coater method, etc. may be adopted. Here, after the green sheet 10 has been formed on the metal conductor layer 12 by means of the casting method, a thermal stamping process is preferably applied thereon so as to press-bond them.

The formation method of the mask 13 includes a photolithography method for forming resist by means of exposure and a printing method (offset printing, gravure printing, screen printing, etc.). In the present embodiment, since the material that contains $Al_2O_3$ having virtually no sintering shrinkage as its main component is used as the mask 13, a printing method suitable for such a material is adopted; however, the photolithography method may be adopted depending on materials.

Although the printing method and the photolithography method are suitable for forming fine pattern wiring, these methods, when adopted, require a process in which the green sheet 10 is immersed in a chemical liquid such as a developing liquid, an etchant and a mask separating liquid. For this reason, the green sheet 10 might be affected by such a chemical liquid and damaged. However, the binder, which contains an acrylic resin having no polar group, has a superior water resistant property so that, even if the green sheet 10 is immersed in the etchant together with the metal conductor layer 12, no damage is caused in the green sheet 10.

Here, in the case when Cu is used as the metal conductor layer 12, it is preferable to use a water solution of ferric chloride as the etchant. If a water solution of dilute hydrochloric acid is used as the etchant, and if this is applied to a glass green sheet, the glass composition will be damaged, and even if this is sufficiently washed by water and dried, and then subjected to a firing process, this can not be finely sintered. The water solution of ferric chloride is free from such a problem.

A binding sheet 4 is stacked in a laminated manner on either both sides or one side of the green sheet 10 manufactured as described above (in the present embodiment, on both sides). In the same manner as the mask 13, the binding sheet 4 is made from a material containing an inorganic composition that virtually is not sintered at the time of the firing process of the green sheet 10.

After the binding sheet 4 has been stacked in a laminated manner, the laminated body is thermally press-bonded. The above-mentioned sequence of the manufacturing processes may be modified or partially omitted, if necessary.

Then, the resulting green sheet laminated body is subjected to a binder-eliminating process in a heater, and then subjected to a firing process. Then, the binding sheet 4 is entirely removed to obtain a double-sided wiring board shown in FIG. 1. Here, even after the firing process of the green sheet 10, the mask 13 is allowed to remain on the wires 2; however, as described above, since the mask 13 is made from virtually the same material as that of the binding sheet 4, the mask 13 on the wires 2 is simultaneously removed during a removing process for the binding sheet 4. Thus, it is possible to omit the process for removing the mask 13 from the wires 2, and consequently to cut the production costs and shorten the production time.

The atmosphere of such a heating process is changed depending on the kinds of the metal conductor layer 12; and in the case of the application of Au, Ag, Pd, Cu, etc. that are not oxidized in the air as the metal conductor layer 12, any of air, nitrogen, hydrogen, vapor, carbon dioxide and mixed gases of these maybe used in accordance with the purpose thereof. In contrast, in the case of the application of Cu, Ni, etc. that are oxidized in the air, the atmosphere is limited to an inert atmosphere, for example, nitrogen, hydrogen, vapor, carbon dioxide and mixed gases of these.

In the double-sided wiring substrate formed in the manufacturing method of the present embodiment, the binding sheet 4 is stacked and sintered so that the sintering shrinkage mainly occurs in a direction perpendicular to the surface with virtually no shrinkage occurring in the X-Y direction; therefore, even if this is fired simultaneously with the wires that have no shrinkage during the firing process, no cracks, etc. occur.

Moreover, in the case of the application of copper oxide paste, it is necessary to carry out a process which tends to cause an increase in the conductor resistivity of the wires 2, that is, a process in which the wires 2 have a volume shrinkage in a reducing process under a reducing atmosphere of hydrogen or nitrogen after the binder-eliminating process, and are then fired; in contrast, since the present embodiment does not require such a process, it is possible to improve, that is, to reduce the wiring resistivity of the wires 2.

(Second Embodiment)

Figure 3:
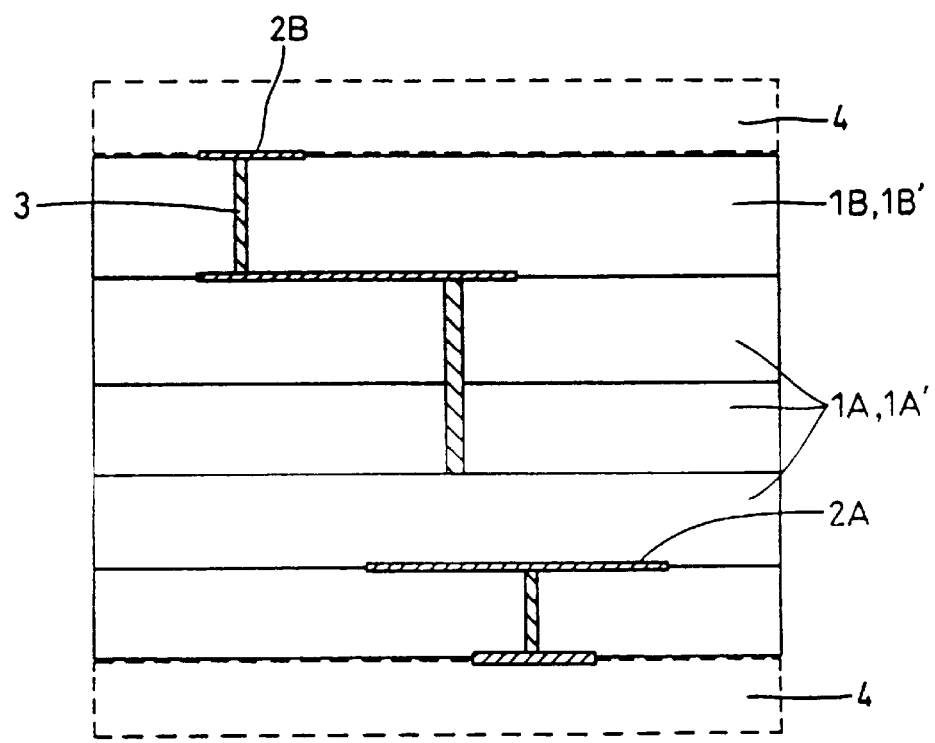
FIG. 3 is a cross-sectional view that shows respective processes in the second and third embodiments.

FIG. 3 is a schematic cross-sectional view that shows a multi-layer wiring board in the second preferred embodiment of the present invention. As illustrated in FIG. 3, the multi-layer wiring board of the present embodiment is provided with inner substrate layers 1A, outer substrate layers 1B, inner wires 2A, outer wires 2B and connection via 3.

The inner wires 1A are provided as a plurality of laminated layers. Each outer substrate layer 1B is stacked in a laminated manner on either both sides or one side of the laminated body of the inner substrate layers 1A. In the FIG., the outer substrate layers 1B are placed on both sides of the laminated body of the inner substrate layers 1A. Each inner wire 2A is interpolated between the inner substrate layers 1A. The outer wire 2B is placed on the surface of the outer substrate layer 1B. The connection via 3 penetrate the inner substrate layers 1A and the outer substrate layers 1B so as to electrically connect the inner wires 2A with each other as well as the inner wire 2A and the outer wire 2B.

Here, reference numeral 4 represents a binding sheet that is placed on the outside of the outer substrate layer 1B only in a manufacturing process which will be described later.

The inner substrate layers 1A and the outer substrate layers 1B contain ceramics that includes glass ceramics, as their main component. The inner wires 2A and the outer wires 2B, which have a rate of voids of not more than 1%, are made from a conductor having virtually no voids. More specifically, the inner wires 2A and the outer wires 2B are constituted by metal foil. The binding sheet 4 is a sheet which contains an inorganic composition that has virtually no sintering shrinkage at the firing temperature of the inner and outer substrate layers 1A and 1B as its main component, and prior to the firing process of the multi-layer wiring board, the sheet is stacked on either both sides or one side of the green sheet used for the outer layer of the multi-layer wiring board (which forms the outer substrate layer 1B after the firing process) in a laminated manner; however, after completion of the firing process, the layer is entirely removed.

Next, an explanation will be given of a manufacturing method for the multi-layer wiring board of the present embodiment.

First, with respect to materials for the multi-layer wiring board, inner-layer-use green sheets 10A and outer-layer-use green sheets 10B that form the inner substrate layers 1A and the outer substrate layers 1B, and conductor paste used for the connection via 3 (hereinafter, referred to as via paste) are prepared. In this case, ceramics collectively represent inorganic insulating materials including glass ceramics.

The inner-layer-use and outer-layer-use green sheets 10A and 10B are manufactured in the same method as the green sheet 10 in the first embodiment.

After holes, which are to be filled with the connection via 3, have been machined in the inner-layer-use and outer-layer-use green sheets 10A and 10B thus manufactured, via paste is injected into the holes so that the connection via 3 are formed. The composition of the via paste and the manufacturing method of the connection via 3 are the same as those in the first embodiment.

Next, inner wires 2A and outer wires 2B, each containing a conductor having virtually no voids as its main component, are formed on the surfaces of the inner-layer-use and outer-layer-use green sheets 10A and 10B. The manufacturing method of the inner and outer wires 2A and 2B is the same as that of the first embodiment shown in FIG. 2. However, in the case of the inner wire 2A formed on the inner-layer-use green sheet 10A, the mask 13 is removed after the inner wire 2A have been formed.

The removing process of the mask 13 is carried out as follows: In the case when a mask 13 made from an acrylic resin binder and a powder component is used, any solvent properly selected from solvents, such as methanol, ethyleneglycol and dimethylformaldehyde, that are chemical agents for dissolving the binder may be used as a removing agent; thus, the mask 13 is easily removed. Here, the ratio of the binder and the powder component constituting the mask 13 may be changed so that the mask is removed by the washing process after etching. Moreover, the mask can be removed by using a dry etching process, and in this case, it is possible to prevent damages to the green sheet caused by the removing process.

After the inner and outer wires 2A and 2B have been formed in the inner-layer-use and outer-layer-use green sheets 10A and 10B as described above, the inner-layer-use and out-layer-use green sheets 10A and 10B are laminated. Upon lamination, after one or a plurality of the inner-layer-use green sheets 10A have been stacked, the outer-layer-use green sheet 10B is stacked on the outermost layer of the laminated body of the inner-layer-use green sheets 10A. In this case, the outer-layer-use green sheet 10B is arranged so that the formation face of the outer wire 2B faces outside.

A binding sheet 4 is stacked in a laminated manner on either both surfaces or one surface on the outside of the green sheet laminated body formed as described above. In the present invention, the binding sheets 4 are placed on both surfaces of the green sheet laminated body. In the same manner as the mask 13, the binding sheet 4 is made from a material containing an inorganic composition that virtually is not sintered at the time of the firing process of the inner-layer-use and outer-layer-use green sheets 10A and 10B.

After the binding sheets 4 have been stacked on the green sheet laminated body in a laminated manner, this is thermally press-bonded to obtain a laminated body. The above-mentioned sequence of the manufacturing processes may be modified or partially omitted, if necessary.

Then, the resulting laminated body is subjected to a binder-eliminating process in a heater, and then subjected to a firing process. Then, the binding sheets 4 are entirely removed to obtain a multi-layer wiring board shown in FIG. 3. Here, even after the firing process of the laminated body, the mask 13 is still allowed to remain on the outer wires 2B; however, as described above, since the mask 13 is made from virtually the same material as that of the binding sheet 4, the mask 13 on the outer wires 2B is simultaneously removed during a removing process for the binding sheet 4. Thus, it is possible to omit the process for removing the mask 13 from the outer wires 2B, and consequently to cut the production costs and shorten the production time.

The atmosphere of such a heating process is changed depending on the kinds of the metal conductor layer 12; and in the case of the application of Au, Ag, Pd, etc. that are not oxidized in the air as the metal conductor layer 12, any of air, nitrogen, hydrogen, vapor, carbon dioxide and mixed gases of these may be used in accordance with the purpose thereof. In contrast, in the case of the application of Cu, Ni, etc. that are oxidized in the air, the atmosphere is limited to an inert atmosphere, for example, nitrogen, hydrogen, vapor, carbon dioxide and mixed gases of these.

In the multi-layer wiring board formed in the manufacturing method of the present embodiment, the binding sheets 4 are stacked and fired so that the sintering shrinkage mainly occurs in a direction perpendicular to the surface with virtually no shrinkage occurring in the X-Y direction; therefore, even if this is fired simultaneously with the inner and outer wires 2A and 2B (that have no shrinkage during the firing process), no cracks, etc. are caused by the simultaneous firing process.

Moreover, since the inner and outer wires 2A and 2B are made from a conductor that has virtually no voids without containing a paste component, no binder-eliminating process is required for the wires 2A and 2B. For this reason, it is possible to eliminate the generation of bubbles that would be caused by the binder-eliminating process, and in the case of the application of copper oxide paste, it is also possible to omit a process causing an increase in the conductor resistivity of the inner and outer wires 2A and 2B, that is, a process in which the inner and outer wires 2A and 2B have a volume shrinkage in a reducing process under a reducing atmosphere of hydrogen or nitrogen after the binder-eliminating process, and are then fired; consequently, it becomes possible to reduce the wiring resistivity of the inner and outer wires 2A and 2B.

Additionally, in the second embodiment, the inner and outer wires 2A and 2B are formed by etching; however, these may be formed by a vapor deposition method, a sputtering method or a plating method. These methods allow the film formation and the wiring pattern formation to be carried out simultaneously, thereby making it possible to easily form a fine pattern.

(Third Embodiment)

The multi-layer wiring board of the present embodiment has basically the same structure as the second embodiment, and is manufactured by the same manufacturing method; however, the composition of the inner-layer-use green sheets 10A' and 10B' that form the inner and outer substrate layers 1A' and 1B' is slightly different. Since the other structures and manufacturing methods are the same as those of the second embodiment, the detailed description thereof is omitted.

An explanation will be given of the composition of the inner-layer-use and outer-layer-use green sheets 10A' and 10B' that feature the present embodiment. The ceramics material of the green sheets 10A' and 10B' is the same as that of the first and second embodiments; however, there is a difference in the composition of the organic binder.

Although the organic binder has basically the same structure as the first embodiment, it does not contain an acrylic resin having no polar group.

Here, since the acrylic resin having no polar group is not contained, the inner-layer-use and outer-layer-use green sheets 10A' and 10B' might be damaged by the etchant when the inner and outer wires 2A and 2B are patterned by wet-etching. In order to solve such a problem, base films which are chemically stable are affixed to the rear surfaces of the inner-layer-use and outer-layer-use green sheets 10A' and 10B'; thus, in cooperation with the metal conductor layers 12 that cover the surfaces of the inner-layer-use and outer-layer-use green sheets 10A' and 10B', these films make it possible to reduce to a minimum adverse effects given from the etchant to the connection via 3 and the inner-layer-use and outer-layer-use green sheets 10A' and 10B'. Moreover, such adverse effects by the etchant may also be prevented by selecting the organic binder to be contained in the inner-layer-use and outer-layer-use green sheets 10A' and 10B'. Moreover, with respect to the mask removing method, a dry etching process may be adopted; this makes it possible to prevent damages to the green sheets caused by the removing process. Furthermore, when the dry etching process is adopted to remove the mask, it becomes possible to eliminate the necessity of using the inner-layer-use and outer-layer-use green sheets 10A' and 10B' respectively in a separated manner as described in the present embodiment; thus, it becomes possible to further simplify the process. Here, this method is particularly effective when fine pattern wires in which L/S (line/space) is set to not more than 75 $\mu$m/75 $\mu$m are formed.

In the multi-layer wiring board formed in the manufacturing method of the present embodiment, the binding sheets 4 are stacked and fired so that the sintering shrinkage mainly occurs in a direction perpendicular to the surface with virtually no shrinkage occurring in the X-Y direction; therefore, even if this is fired simultaneously with the inner and outer wires 2A and 2B (that have no shrinkage during the firing process), no cracks, etc. are caused by the simultaneous firing process.

Moreover, since the inner and outer wires 2A and 2B are made from a conductor that has virtually no voids without containing a paste component, no binder-eliminating process is required for the wires 2A and 2B. For this reason, it is possible to eliminate the generation of bubbles that would be caused by the binder-eliminating process. In the case of the application of copper oxide paste, it is necessary to provide a process which tends to cause an increase in the conductor resistivity of the inner and outer wires 2A and 2B, that is, a process in which the inner and outer wires 2A and 2B have a volume shrinkage in a reducing process under a reducing atmosphere of hydrogen or nitrogen after the binder-eliminating process, and are then fired; in contrast, since the present embodiment does not require such a process, it becomes possible to reduce the wiring resistivity of the inner and outer wires 2A and 2B.

Additionally, in the third embodiment, the inner and outer wires 2A and 2B are formed by etching; however, these may be formed by a vapor deposition method, a sputtering method or a plating method. These methods allow the film formation and the wiring pattern formation to be carried out simultaneously, thereby making it possible to easily form a fine pattern.

(Fourth Embodiment)

Referring to FIG. 4, the following description will discuss the fourth embodiment of the present invention. Except the following point, the present embodiment is the same as the third embodiment. That is, in the multi-layer wiring board of the third embodiment, the inner and outer wires 2A and 2B are allowed to directly contact the inner and outer substrate layers 1A' and 1B'; however, in the multi-layer wiring board of the present embodiment, glass bonding layers 20A, 20B and 20C are respectively interpolated between the inner and outer wires 2A, 2B and the inner and outer substrate layers 1A', 1B'. Therefore, in the present embodiment, those members that are the same as those of the third embodiment are represented by the same reference numerals, and the description thereof is omitted. Moreover, those members that are not particularly explained are supposed to have the arrangements as the third embodiment.

As illustrated in FIG. 4, the multi-layer wiring board of the present embodiment is provided with the inner and outer substrate layers 1A' and 1B', glass bonding layers 20A, and connection via 3. The inner and outer substrate layers 1A' and 1B' are made from ceramics containing glass ceramics. The inner and outer wires 2A and 2B, which are made of a metal conductor, are respectively placed between the substrate layers 1A and 1B and on the outer substrate layer 1B. The glass bonding layer 20A is formed on the inner wire 2A. The connection via 3 penetrate the inner and outer substrate layers 1A' and 1B' so as to electrically connect the inner wires 2A with each other and the inner wire 2A and the outer wire 2B. In the fourth embodiment, the glass bonding layer 20A is formed on the inner wire 2A so that the bonding strength between the inner wires 2A and the inner and outer substrate layers 1A and 1B can be stabilized.

Figure 5:
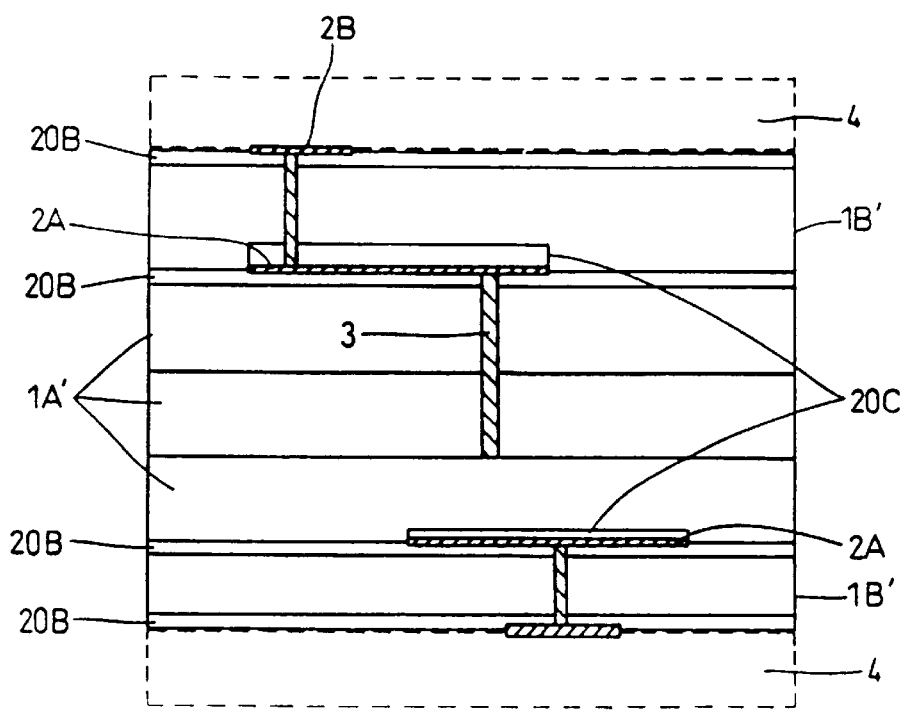
FIG. 5 is a cross-sectional view that shows a modified example of the fourth embodiment.

Moreover, FIG. 5 shows a modified example of the present embodiment. This multi-layer wiring board is provided with the inner and outer substrate layers 1A' and 1B', glass bonding layers 20B and 20C, inner and outer wires 2A and 2B, and connection via 3. The inner and outer substrate layers 1A' and 1B', the inner and outer wires 2A and 2B and the connection via 3 are arranged in the same manner as the fourth embodiment. Moreover, the glass bonding layer 20C also has the same structure as the glass bonding layer 20A of the fourth embodiment. This modified example features that the glass bonding layers 20B are installed. The glass bonding layers 20B are placed on the upper surfaces of the inner and outer substrate layers 1B; thus, the glass bonding layers 20B make it possible to further stabilize the bonding strength between the inner and outer substrate layers 1A', 1B' and the inner and outer wires 2A and 2B.

Here, the binding sheet 4 is a sheet which contains as its main component an inorganic composition that has virtually no sintering shrinkage at the firing temperature of the substrate layers 1A' and 1B' in a manufacturing process as will be described later, and is formed in the same manner as that described in the aforementioned embodiments.

Next, an explanation will be given of a manufacturing method of the multi-layer wiring board in the present embodiment. In the manufacturing method of the metal conductor multi-layer wiring board of the present embodiment, masks 13' (see FIG. 3), which are formed on the inner and outer wires 2A and 2B, are replaced by glass bonding layers 20A and 20C, and these glass bonding layers 20A and 20C are allowed to remain thereon. Moreover, glass bonding layers 20B are added and respectively interpolated between the inner-layer-use and outer-layer-use green sheets 10A', 10B' and the inner and outer wires 2A, 2B.

The respective parts of the present embodiment are the same as those of the third embodiment except that these glass bonding layers 20A, 20B and 20C are glass layers.

With respect to the material forming the glass bonding layers 20A, 20B and 20C used in the present embodiment, it is not particularly limited as long as it is not dissolved by the wiring-use etchant. For example, in the case of a sintering temperature of 900° C., materials such as lead borosilicate glass having a softening temperature of not more than 900° C. and alkali metal glass having a softening temperature of not more than 500° C. are listed. It is preferable to adopt the latter, since greater bonding strength is obtained between the inner and outer substrate layers 1A, 1B and the inner and outer wires 2A, 2B.

Next, an explanation will be given of examples to which the respective embodiments of the present invention are actually applied.

In the following applied examples 1 to 4, the double-sided wiring boards and the multi-layer wiring boards in the first through fourth embodiments are tested, and the following samples are prepared: samples in which the organic binder forming the green sheet, samples in which kinds of the inner and outer substrate layers 1A, 1B, 1A' and 1B', kinds of the inner and outer wires 2A and 2B, and kinds of intermediate layers (glass bonding layers 20A, 20B and 20C) placed between the inner and outer substrate layers 1A, 1B, 1A', 1B' and the inner and outer wires 2A, 2B are varied, samples in which the manufacturing method of a conductor forming the inner and outer wires 2A and 2B is varied, and samples in which the pattern forming method of the inner and outer wires 2A and 2B is varied. Then, these samples are compared in their performances. With respect to the samples of the respective applied examples, those samples having no intermediate layers (glass bonding layers 20A, 20B and 20C) between the inner and outer substrate layers 1A, 1B, 1A', 1B' and the inner and outer wires 2A, 2B are related to the first to third embodiments, and those having the intermediate layers (glass bonding layers 20A, 20B, 20C) are related to the fourth embodiment. Moreover, in the applied example 1, the present invention is applied to a double-sided wiring board; and since the data thereof are basically the same as those of the second embodiment relating to a multi-layer wiring board, the applied example 1 is virtually considered to be applicable to both the first and second embodiments.

Here, in order to confirm the effects of the present invention, samples that are used for comparison with the present invention were prepared together with the above-mentioned samples. The distinction between those comparative examples and the examples of the present invention is made by denoting "E" for the applied examples of the present invention and denoting "C" for the comparative examples that are not formed in accordance with the present invention, in the item "E/C" in the comparative table showing the results of the respective examples.

Moreover, in the applied examples of 1 to 4, the present invention is exemplified by the case in which a metal conductor made of Ag or Cu featuring a low electric resistivity is used as the inner and outer wires 2A and 2B. Since Ag as well as Cu has a low melting point, it is necessary to use a ceramics material that can be sintered at a low temperature. For this reason, with respect to the applied examples 1 to 3, glass ceramics of a glass-alumina mixture is selected as the ceramics material. However, as shown in applied example 4, the present invention of course is not intended to be limited by this glass ceramics.

APPLIED EXAMPLE 1

Table 1 and Table 2 show the results obtained by measuring the characteristics of the double-sided wiring board manufactured by the method of the present invention and the outer wire 2B. In the present applied example, any of the samples was manufactured as a double-sided wiring board in accordance with the following method in which Cu foil is used as surface layer wires on both sides thereof.

First, an acrylic resin and terpineol were sufficiently mixed and kneaded with Cu powder and fusing-use glass powder by using three rolls; thus, via paste was prepared.

Next, substrate-layer-use powder (sintering temperature: 900° C.) of a glass-alumina mixture, a methacrylic-acid based acrylic resin (molecular weight: $2\times10^5$) containing a hydroxyl group which serves as a binder, benzylbutylphthalate that serves as a plasticizer and toluene that serves as a solvent were sufficiently mixed and kneaded in a ball mill, and then defoamed so as to prepare a slurry. The resulting slurry was molded into a sheet shape on a base film (polyphenylsulfide) the surface of which had been subjected to a mold-releasing treatment; thus, a green sheet 10 having a thickness of 200 μm was manufactured. The molding process was carried out by the doctor blade method.

Next, via holes, each having a diameter of 0.2 mm φ, were formed by punching at predetermined positions in the green sheet 10, and the above-mentioned via paste was injected into these via holes so that connection via 3 were formed. Then, Cu foil, which has a flat surface (surface roughness: not more than 0.2 μm) and a thickness of 18 μm, was press-bonded onto the surface of the green sheet 10. The press-bonding process was carried out at a temperature of 80° C.

Figure 6:
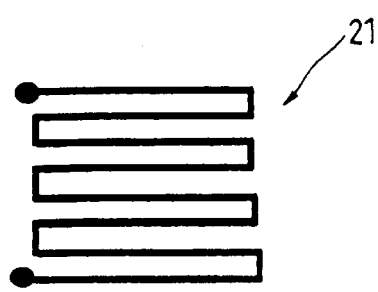
FIG. 6 is a plan view that shows the construction of a wiring pattern used for measuring sheet resistance.

After an alumina film had been formed on the Cu foil thus press-bonded by using alumina paste containing an acrylic resin binder that is the same material as the binding sheet 4, which will be described later, this alumina film was patterned by the printing method so that a mask 13 was formed. Moreover, the green sheet 10 was subjected to wet-etching by using various etchants so as to pattern the Cu foil; thus wires 2A and 2B were obtained. Here, the patterns of these wires 2A and 2B were prepared as sheet-resistance measuring wiring patterns as shown in FIG. 6, and the minimum line width was set to 75 μm with the minimum width between lines being set to 75 μm. Moreover, wires 2A and 2B having a pattern of 2 mm in square were also prepared as insulating resistance measuring patterns.

After the binding sheet 4 had been placed on the outside of the green sheet 10 on which the wires 2A and 2B were formed, and then thermally press-bonded. The binding sheet 4 was made from a material having alumina as its main component, an acrylic resin as a binder, benzylbutylphthalate as a plasticizer, and toluene as a solvent.

The resulting laminated body was subjected to a binder-eliminating process in a heater in a nitrogen atmosphere containing 20 ppm of oxygen at 650° C., and the firing process was carried out in a nitrogen atmosphere at 900° C. for a maintaining period of 10 minutes. After the firing process, the binding sheet 4 adhering to the two surfaces of the sintered body and the mask 13 on the outer wires 2B were removed by washing; thus, a double-sided wiring board was obtained.

Any one of the samples described below was manufactured by the above-mentioned method; and factors, such as the binder used in the green sheet, in particular, the content of the acrylic resin having no polar group, and the etchant used for forming the wiring pattern, were varied.

Sample No. 1

This sample was formed by a green sheet 10 having a polyvinylbutyral (PVB) resin as its main component that serves as an organic binder, and features that it does not contain any acrylic resin having no polar group, and a water solution of ferric chloride was used as an etchant. The time during which the green sheet 10 is immersed in the etchant was set to approximately 10 minutes.

Sample No. 2

This sample was basically prepared by using the same manufacturing method as sample No. 1; however, it is different from sample No. 1 in that an organic binder made from only the acrylic resin having no polar group is used therein.

Sample No. 3

This sample was basically prepared by using the same manufacturing method as sample No. 2, and an organic binder made from the acrylic resin was used in the same manner as sample No. 2; however, it is different from sample No. 2 in that the acrylic resin is a methacrylic-acid-based resin. Moreover, it is also different from sample No. 2 in that the organic binder contains an acrylic resin having a hydroxyl group (OH—) as its main component in order to improve the dispersing property of ceramics powder and in that it does not contain any acrylic resin having no polar group.

Sample No. 4

This sample was basically prepared by using the same manufacturing method as sample No. 3, and the organic binder having a methacrylic-acid-based acrylic resin as its main component was used in the same manner as sample No. 3; however, it is different from sample No. 3 in that the organic binder contains an acrylic resin having no polar group at a weight rate of 8%.

Sample No. 5

This sample was basically prepared by using the same manufacturing method as sample No. 3, and the organic binder having a methacrylic-acid-based acrylic resin as its main component was used in the same manner as sample No. 3; however, it is different from sample No. 3 in that the organic binder contains an acrylic resin having no polar group at a weight rate of 10%.

Sample No. 6

This sample was basically prepared by using the same manufacturing method as sample No. 4; however, it is different from sample No. 4 in that the organic binder contains an acrylic resin having no polar group at a weight rate of 20%.

Sample No. 7

This sample was basically prepared by using the same manufacturing method as sample No. 4; however, it is different from sample No. 4 in that a water solution of dilute hydrochloric acid is used as an etchant upon forming wiring patterns.

Sample No. 8

This sample was basically prepared by using the same manufacturing method as sample No. 4; however, it is different from sample No. 4 in that the organic binder contains an acrylic resin having no polar group at a weight rate of 50%.

Sample No. 9

This sample was basically prepared by using the same manufacturing method as sample No. 4; however, it is different from sample No. 4 in that the organic binder contains an acrylic resin having no polar group at a weight rate of 60%.

The characteristics of the respective sample green sheets thus obtained were analyzed, and Table 2 shows the results thereof. Moreover, the external appearance and the cross-section of each of the samples were examined and the wires 2A and 2B formed on both sides thereof were measured so as to obtain insulating resistance, dielectric tangent, etc. Table 1 and Table 2 show the results of the measurements.

the etching could be omitted from the conventional processes. Any of these samples (No. 1 to 9) also showed a low sheet resistivity.

TABLE 1

| Sample No. | Binder used in green sheet | Content of acrylic resin binder having no polar group [%] | Etchant used for forming wiring pattern | Insulating resistivity of substrate after firing process [Ω · cm] | Dielectric tangent of substrate after firing process (1 KHz) | E/C |
|---|---|---|---|---|---|---|
| No. 1 | PVB | 0 | Water solutiom of ferric chloride | $10^8$ | 0.5 | C |
| No. 2 | Acrylic resin binder having no polar group | 100 | Water solutiom of ferric chloride | $10^{14}$ | 0.002 | C |
| No. 3 | Methacrylic-acid-based acrylic resin binder (OH group) | 0 | Water solutiom of ferric chloride | $10^{10}$ | 0.45 | C |
| No. 4 | Methacrylic-acid-based acrylic resin binder (OH group) | 8 | Water solutiom of ferric chloride | $10^{11}$ | 0.2 | E |
| No. 5 | Methacrylic-acid-based acrylic resin binder (OH group) | 10 | Water solutiom of ferric chloride | $10^{12}$ | 0.12 | E |
| No. 6 | Methacrylic-acid-based acrylic resin binder (OH group) | 20 | Water solutiom of ferric chloride | $10^{14}$ | 0.005 | E |
| No. 7 | Methacrylic-acid-based acrylic resin binder (OH group) | 20 | Water solutiom of dilute hydrochloric acid | $10^8$ | 0.6 | C |
| No. 8 | Methacrylic-acid-based acrylic resin binder (OH group) | 50 | Water solutiom of ferric chloride | $10^{14}$ | 0.002 | E |
| No. 9 | Methacrylic-acid-based acrylic resin binder (OH group) | 60 | Water solutiom of ferric chloride | $10^{14}$ | 0.002 | E |

TABLE 2

| Sample No. | Binder used in green sheet | Content of acrylic resin binder having no polar group [%] | Sheet characteristics Sheet strength [Kg/mm$^2$] | Sheet machining property Punch hole of 0.2 mm | Amount of remaining carbon after nitrogen binder-eliminating process ppm | E/C |
|---|---|---|---|---|---|---|
| No. 1 | PVB | 0 | 0.51 | ○ | 23000 | C |
| No. 3 | Methacrylic-acid-based acrylic resin binder (OH group) | 0 | 0.42 | ○ | 1200 | C |
| No. 4 | Methacrylic-acid-based acrylic resin binder (OH group) | 8 | 0.45 | ○ | 550 | C |
| No. 5 | Methacrylic-acid-based acrylic resin binder (OH group) | 10 | 0.47 | ○ | 320 | E |
| No. 6 | Methacrylic-acid-based acrylic resin binder (OH group) | 20 | 0.39 | ○ | 240 | E |
| No. 8 | Methacrylic-acid-based acrylic resin binder (OH group) | 50 | 0.23 | ○–Δ | 150 | E |
| No. 9 | Methacrylic-acid-based acrylic resin binder (OH group) | 60 | 0.12 | × | 130 | C |
| No. 2 | Acrylic resin binder having no polar group | 100 | 0.5 | × | 120 | C |

With respect to all the samples 1 to 9, the binding sheet 4 was placed thereon and they were then fired so that the in-plane shrinkage in the substrate was maintained at not more than 0.1%, and none of disconnection, warpage, cracks, etc. occurred in the outer wires 2A and 2B. Moreover, with respect to the samples 1 to 9, upon washing the binding sheet 4 with water, the mask 13 on the outer wires 2A and 2B was also removed completely; thus, it was confirmed that the removing process for the mask 13 after Sample No. 1 showed superior strength and machining property in its green sheet; however, the thermal decomposition thereof under a nitrogen atmosphere hardly progressed, resulting in an amount of remaining carbon as much as 23000 ppm.

With respect to sample No. 2 made from an acrylic resin binder having a superior thermal decomposing property, its thermal decomposition sufficiently progressed so that the removing process of the binder was carried out smoothly with hardly any carbon remaining. However, since its acrylic resin binder contained no polar group that would contribute to the dispersing property of the acrylic resin binder, the content of the binder in the green-sheet-use slurry had to be reduced so as to prevent gelation; therefore, this sample is susceptible to gelation. Moreover, since the binder without polar group tends to have a greater molecular weight and fail to provide slurry having a good dispersing property, it is not possible to obtain a value of not less than 20 Kg/cm$^2$ that is sufficient sheet strength; consequently, it is not possible to obtain proper strength and machining property of the green sheet.

Although sample No. 3 provided a green sheet having sufficient sheet strength and a superior thermal decomposing property, it failed to provide sufficient water resistant property and etching resistant property, with the result that discoloration due to the etchant did not disappear even after sufficient washing carried out after the etching process. Moreover, the removing process of the binder was slightly insufficient, resulting in a slightly greater carbon remaining amount of 1200 ppm. For this reason, the density insulating resistivity after the firing process showed a reduced value of $10^{10}$ Ω·cm, that is, a slightly reduced property.

As in the case of samples No. 4, No. 5, No. 6, No. 8 and No. 9, the binder resin was allowed to contain acrylic resins having no polar group respectively at 8%, 10%, 20%, 50% and 60% in order to improve the water resistant property, the etching performance was improved while the strength and the machining property of the green sheet were maintained properly. Moreover, the insulating resistivities after the firing process were respectively increased to $10^{11}$ Ω·cm, $10^{12}$ ·cm, $10^{14}$ Ω·cm, $10^{14}$ Ω·cm and $10^{14}$ Ω·cm. These results show that the optimal content of the acrylic resin having no polar group is preferably set to at least not less than 10%, and more preferably to a level of not less than 20%. The content of 8% made the insulating resistivity slightly as low as $10^{10}$ Ω·cm, and also made the amount of residual carbon slightly as high as 550 ppm, resulting in insufficiency. In contrast, the content of 50% made the slurry slightly susceptible to gelation, resulting in irregularities in the sheet thickness direction with variations in the thickness of not less than 10%. Moreover, since the content of 50% partially caused cracks after the punching process, failing to provide a sufficient sheet machining property. Therefore, the content of the acrylic resin having no polar group is set to have an upper level of 50%. Here, the content of 60% continuously provided a good dielectric property in the substrate; however, it resulted in a great reduction to 12 Kg/cm$^2$ in the sheet strength as well as great degradation in the machining property.

Moreover, as shown by sample No. 7, in the case when the etchant was changed from a water solution of ferric chloride to a water solution of dilute hydrochloric acid, with respect to glass components, particularly, to lead borosilicate glass, the green sheet became susceptible to damages in its composition, failing to be finely sintered in the firing process, with the result that the insulating resistivity only provided a value as low as $10^8$ Ω·cm. Additionally, with respect to the etchant, it is confirmed that the application of cupric chloride also makes it possible to provide preferable results.

APPLIED EXAMPLE 2

Table 3 shows the results obtained by measuring the characteristics of the multi-layer wiring board manufactured by the method of the present invention and the outer wire 2B. In the present applied example, any of the samples was manufactured as a multi-layer wiring board in accordance with the following method in which Cu foil is used as the outer wire 2B.

Sample No. 10

First, an acrylic resin and terpineol were sufficiently mixed and kneaded with Cu powder and fusing-use glass powder by using three rolls; thus, via paste was prepared.

Next, substrate-layer-use powder (sintering temperature: 900° C.) of a glass-alumina mixture, an acrylic resin that serves as a binder, benzylbutylphthalate that serves as a plasticizer and toluene that serves as a solvent were sufficiently mixed and kneaded in a ball mill, and then defoamed so as to prepare a slurry. The resulting slurry was molded into a sheet shape on abase film (polyphenylsulfide) the surface of which had been subjected to a mold-releasing treatment; thus, inner-layer-use and outer-layer-use green sheets 10A and 10B, each having a thickness of 200 μm, were manufactured. The molding process was carried out by the doctor blade method.

Next, via holes, each having a diameter of 0.2 mm φ, were formed by punching at predetermined positions in the inner-layer-use and outer-layer-use green sheets 10A and 10B, and the above-mentioned via paste was injected into these via holes so that connection via 3 were formed. Then, Cu foil, which has a flat surface (surface roughness: not more than 0.2 μm) and a thickness of 18 μm, was press-bonded onto each of the surfaces of the inner-layer-use and outer-layer-use green sheets 10A and 10B. The press-bonding process was carried out at a temperature of 80° C.

After an alumina film had been formed on the Cu foil thus press-bonded by using alumina paste containing an acrylic resin binder that is the same material as the binding sheet 4, which will be described later, this alumina film was patterned by the printing method so that a mask 13 was formed. Moreover, each of the inner-layer-use and outer-layer-use green sheets 10A and 10B was subjected to wet-etching so as to pattern the Cu foil; thus wires 2A and 2B were obtained. Here, the patterns of these wires 2A and 2B were prepared as sheet-resistance measuring wiring patterns as shown in FIG. 6, and the minimum line width was set to 50 μm with the minimum width between lines being set to 50 μm. Moreover, wiring layers 2A and 2B having a pattern of 2 mm in square were also prepared as insulating resistance measuring patterns.

After the wires 2A and 2B had been formed, only the mask 13 on the inner wire 2A was removed.

The inner-layer-use and outer-layer-use green sheets 10A and 10B having the inner and outer wires 2A and 2B respectively formed thereon were laminated with the outer-layer-use green sheet 10B placed outside. In this case, the positions of the two ends of each of the inner and outer wires 2A and 2B were aligned so as to coincide with the positions of the connection via 3.

Moreover, after a binding sheet 4 had been placed on the outside of the outer-layer-use green sheet 10B, this laminated body was thermally press-bonded. The binding sheet 4 was made from a material having alumina as its main component, an acrylic resin as a binder, benzylbutylphthalate as a plasticizer, and toluene as a solvent.

The resulting laminated body was subjected to a binder-eliminating process in a heater in a nitrogen atmosphere containing 20 ppm of oxygen at 650° C., and the firing process was carried out in a nitrogen atmosphere at 900° C. for a maintaining period of 10 minutes. After the firing process, the binding sheet 4 adhering to each of the two surfaces of the sintered body and the mask 13 on the outer wire 2B were removed by washing; thus, a multi-layer wiring board was obtained.

Sample No. 11

This sample was basically prepared by using the same manufacturing method as sample No. 11; however, it is different from sample No. 11 in that the Cu foil that was to form the inner and outer wires 2A and 2B had been subjected to a roughening process on both sides thereof, and in that the Cu foil was press-bonded onto the inner-layer-use and outer-layer-use green sheets 10A and 10B with the Cu foil being set at room temperature.

Sample No. 12

This sample was basically prepared by using the same manufacturing method as sample No. 11; however, it is different from sample No. 11 only in that the Cu foil that was to form the inner and outer wires 2A and 2B had been subjected to a roughening process on both sides thereof.

Sample No. 13

This sample was basically prepared by using the same manufacturing method as sample No. 11; however, it is different from sample No. 11 in that the Cu foil that was to form the inner and outer wires 2A and 2B had been subjected to a roughening process on both sides thereof, and in that a sheet was formed on the roughened Cu foil by using the slurry having the above-mentioned composition through the doctor blade forming method so that the inner-layer-use and outer-layer-use green sheets 10A and 10B were integrally formed with the Cu foil.

Sample No. 14

This sample is different from sample No. 10 in that the Cu foil that was to form the inner and outer wires 2A and 2B had been subjected to a roughening process on both sides thereof, and in that not the printing method, but the photolithography method was used as the patterning method of the Cu foil (in the manufacturing process of the inner and outer wires 2A and 2B) Here, with respect to resist used for the photolithography method, a photosensitive resin that melts in ethyleneglycol was adopted.

Sample No. 15

This sample is different from sample No. 10 in that the Cu foil that was to form the inner and outer wires 2A and 2B had been subjected to a roughening process on both sides thereof, and in that after the laminated body had been fired the outer wire 2B was patterned.

In other words, after the inner wire 2B had been formed on the inner-layer-use green sheet 10B, the Cu foil was laminated and placed on the outer-layer-use green sheet 10B. Then, after these inner-layer-use and outer-layer-use green sheets 10A, 10B and the binding sheet 4 had been laminated and thermally press-bonded to each other, this was subjected to a firing process under the same conditions as sample No. 10. After the firing process, the binding sheet 4 adhering to each of the two surfaces of the sintered body was removed by washing, and the Cu foil was then patterned by the photolithography method so that an outer wire 2B was formed.

Sample No. 16

This sample, which represents a comparative example of the present invention, was basically prepared by using the same manufacturing method as sample No.10; however, it is completely different therefrom in that the inner and outer wire 2A and 2B were formed by the screen printing method using conductive paste.

The external appearance and the cross-section of each of the samples No. 10 to 16 were examined and the connecting property between the outer wire 2B and the connection via 3 and the sheet resistivity of the outer wire 2B were measured through the connection via 3 inside the outer substrate layer 1B by means of the four-terminal method. Moreover, the solder wettability was confirmed with respect to the electrode of 2 mm in square, and after the soldering process, the bonding strength was measured by using a Cu line having a diameter of 1 mm φ. Here, the measured values were converted to values in the case of an area of 1 mm in square.

TABLE 3

| Sample No. | Outer wiring layer (Cu foil) surface | Connecting method | Wiring-layer forming method | Sheet resistivity [mΩ/□] | Bonding strength [Kg/mm$^2$] | E/C |
|---|---|---|---|---|---|---|
| 10 | Smooth | Press-bonding 80° C. | Printing method (Alumina film) | 1.5 | 0.30 | C |
| 11 | Rough | Press-bonding at room temperature | Printing method (Alumina film) | 1.5 | 0.50 | E |
| 12 | Rough | Press-bonding 80° C. | Printing method (Alumina film) | 1.5 | 1.00 | E |
| 13 | Rough | On Cu foil Sheet formation | Printing method (Alumina film) | 1.5 | 1.20 | E |
| 14 | Rough | Press-bonding 80° C. | Photolithography method | 1.5 | 0.85 | E |
| 15 | Rough | Press-bonding 80° C. | Photolithography method Cu foil after firing process | 1.5 | 1.05 | E |
| 16 | Cu glass paste | — | Screen printing method | 2.5 | 0.50 | C |

With respect to all the samples 10 to 15, the binding sheet 4 was placed thereon and they were then fired so that the in-plane shrinkage in the substrate was maintained at not more than 0.1%, and none of disconnection, warpage, cracks, etc. occurred in the outer wire 2B. Moreover, with respect to the samples 10 to 13, upon washing the binding sheet 4 with water, the mask 13 was also removed completely; thus, it was confirmed that the removing process for the mask 13 after the etching could be omitted from the conventional processes. Any of these samples No. 10 to 15 also showed a low sheet resistivity.

Based upon comparison between the results of measurements of the bonding strength of sample No.10 and the bonding strength of sample No. 12, it is confirmed that the roughening process on the Cu foil surface is effective in obtaining proper bonding strength between the outer wire 2B and the outer substrate layer 1A. Similarly, based upon comparison between the results of measurements of the bonding strength of sample No. 11 and the bonding strength of sample No. 12, it is confirmed that the press-bonding process between the outer-layer-use green sheet 10B and the Cu foil should be carried out under a temperature condition that allows the binder to fully exert its adhering force, that is, for example, at a temperature of 80° C. Moreover, although it depends on the process conditions, the results of measurements of the bonding strength of sample No. 13 show that the strength is further increased when, after the formation of the outer-layer-use green sheet 10B on the Cu foil, the two members are bonded. Here, in samples No. 14 and No. 15, in order to achieve finer lines, the photolithography method was used; and it is confirmed that this method also provides a sufficient bonding property between the outer substrate layer 1B and the outer wire 2B. Moreover, in sample No. 15, the simultaneous firing process was carried out on the Cu foil as it is, and the wiring process was then carried out; and it is confirmed this method is also effective. It is found that the bonding property between the Cu foil and the inner-layer-use and outer-layer-use green sheets 10A, 10B at the time of the simultaneous firing process is maintained firmly although no glass bonding layer is provided, even as compared with comparative sample No. 16.

Moreover, no short-circuiting was found on the outer wire 2B in any of the samples so that the wires 2A and 2B were provided as fine lines. When the cross-section after the firing process is examined, it is confirmed that the contacting property between the outer wire 2B and the outer substrate layer 1B is properly achieved. This is because, different from paste, no component is included which releases gas at the time of the binder-eliminating process.

In sample No. 16 (comparative example), the sheet resistivity became slightly higher depending on glass components contained so as to provide a proper fusing property to the substrate. Moreover, gaps tend to occur between the wire and the substrate layer.

As described above, with the method in which, after the formation of the wiring conductor on the green sheet, the surface layer wire and the substrate are simultaneously fired through the in-plane non-shrinkage process, it becomes possible to provide a superior surface layer wiring that has proper bonding strength between the wiring substrates with a low resistivity Additionally, it is confirmed that with respect to the surface layer electrode formed through a thin-film process such as a vapor deposition method and the outer wire 2B and inner wire 2A that is formed by a plating process, it is also possible to provide superior bonding strength and low electrical resistance.

APPLIED EXAMPLE 3

In the present applied example, referring to Table 4, an explanation will be given of the results of measurements made on characteristics of the multi-layer wiring board manufactured by the method of the present invention and its inner wire 2A.
Sample No. 17

Sample No. 17 of the present applied example was manufactured by the following method in which an Ag conductor was used as the inner wire 2A. First, an ethylcellulose resin and terpineol were sufficiently mixed and kneaded with Ag powder and fusing-use glass powder by using three rolls; thus, via paste was prepared.

Next, a powder material used for the inner and outer substrate layers 1A and 1B (sintering temperature: 900° C.) of a glass-alumina mixture, a butyral resin that serves as a binder, benzylbutylphthalate that serves as a plasticizer and butylcarbitol toluene that serves as a solvent were sufficiently mixed and kneaded in a ball mill, and then defoamed so as to prepare a slurry. The resulting slurry was molded into a sheet shape on a base film (polyphenylsulfide) the surface of which had been subjected to a mold-releasing treatment; thus, inner-layer-use and outer-layer-use green sheets 10A and 10B, each having a thickness of 200 $\mu$m, were manufactured. The molding process was carried out by the doctor blade method.

Next, via holes, each having a diameter of 0.2 mm $\phi$, were formed by punching at predetermined positions in the inner-layer-use and outer-layer-use green sheets 10A and 10B, and the above-mentioned via paste was injected into these via holes so that connection via 3 were formed.

Then, a vapor-deposition-use mask (omitted from the Figure) having a shape corresponding to a sheet-resistance measuring wiring pattern 21 shown in FIG. 6 was used so as to carry out Ag vapor deposition on predetermined surface positions on the inner-layer-use and outer-layer-use green sheets 10A and 10B; thus, an inner wire 2A was formed. In this case, the positions of the two ends of each of the inner and outer wires 2A and 2B to be formed were aligned so as to coincide with the positions of the connection via 3.

Then, the inner-layer-use and outer-layer-use green sheets 10A and 10B, thus formed, are laminated so that the positions of the inner and outer wires 2A and 2B and the connection via 3 are coincident with each other.

Next, a binding sheet 4 containing $Al_2O_3$ (Alumina) as its main component was prepared by using the same binder and plasticizer as the inner-layer-use and outer-layer-use green sheets 10A and 10B, and this was thermally press-bonded onto both sides of the laminated body in a sandwiching manner.

The resulting laminated body was subjected to a binder-eliminating process at 600° C. in the air inside a heater, and then to a firing process at 900° C. for a maintaining period of 10 minutes. After the firing process, the binding sheets 4 adhering to both sides of the sintered body were removed by washing, thereby obtaining a multi-layer wiring substrate.

The external appearance and the cross-section of the multi-layer wiring board thus obtained were examined, and the sheet resistivity of the inner wire 2A was measured by the four-terminal method through the exposed via on the multi-layer wiring board. Here, the measured values were converted to experimental values in the case of a conductor film thickness of 15 $\mu$m in the inner wiring 2A.
Sample No. 18

This sample was formed basically in the same method as sample No. 16; however, it is different in that the formation of the inner wire 2A was formed by the sputtering method.
Sample No. 19

Sample No. 19 featured that the inner wire 2A was formed by the plating method by using a Cu conductor as the wiring.

In other words, an acrylic resin and terpineol were sufficiently mixed and kneaded with Cu powder and fusing-use glass powder by using three rolls; thus, via paste was prepared.

Next, substrate-layer-use powder (sintering temperature: 900° C.) of a glass-alumina mixture, an acrylic resin that serves as a binder, benzylbutylphthalate that serves as a plasticizer and toluene that serves as a solvent were sufficiently mixed and kneaded in a ball mill, and then defoamed so as to prepare a slurry. The resulting slurry was molded into a sheet shape on a base film (polyphenylsulfide) the surface of which had been subjected to a mold-releasing treatment; thus, inner-layer-use and outer-layer-use green sheets 10A and 10B, each having a thickness of 200 μm, were manufactured. The molding process was carried out by the doctor blade method.

Next, via holes, each having a diameter of 0.2 mm φ, were formed by punching at predetermined positions in the inner-layer-use and outer-layer-use green sheets 10A and 10B, and the above-mentioned via paste (Cu glass paste) was injected into these via holes so that connection via 3 were formed.

Then, a plating resist pattern was formed on each of the surfaces of the inner-layer-use and outer-layer-use green sheets 10A and 10B at predetermined positions thereon in a shape corresponding to the sheet-resistance measuring pattern 21 shown in FIG. 6; thus, the inner and outer wires 2A and 2B, made of the Cu conductor, were formed as films by using the pattern plating method. Since the inner-layer-use and outer-layer-use green sheets 10A and 10B were to be immersed into a plating liquid, base films were affixed to the rear surfaces of the inner-layer-use and outer-layer-use green sheets 10A and 10B.

Then, a plurality of the inner-layer-use green sheets 10A (or a single green sheet) were laminated so as to make the positions of both ends of the inner and outer wires 2A and 2B and the positions of the connection via 3 coincident with each other.

Next, a binding sheet 4 made of alumina was formed by using the same binder and plasticizer as the inner-layer-use and outer-layer-use green sheets 10A and 10B, and the sheets were thermally press-bonded onto both surfaces of the laminated body of the inner-layer-use and outer-layer-use green-sheet 10A and 10B in a sandwiching manner.

The resulting laminated body was subjected to a binder-eliminating process in a heater in a nitrogen atmosphere containing 20 ppm of oxygen at 650° C., and the firing process was carried out in a nitrogen atmosphere at 900° C. for a maintaining period of 10 minutes.

After the firing process, the binding sheets 4 adhering to both sides of the sintered body were removed by washing; thus, a multi-layer wiring board was obtained.
Sample No. 20

This sample No. 20 was basically manufactured in the same method as sample No. 19; however, it is different therefrom in that after a Cu layer had been formed on the inner-layer-use green sheet 10A by the plating method, this was patterned by the photolithography method so as to manufacture an inner wire 2A.

In other words, after the Cu plating film had been formed onto the inner-layer-use green sheet 10A by the plating method, a mask 13 having a shape corresponding to the resistivity measuring wiring pattern 21 shown in FIG. 6 was formed by the photolithography method. Here, with respect to resist used for the photolithography method, a photosensitive resin that dissolves in ethyleneglycol was adopted.

Thereafter, this was subjected to an etching process so that unnecessary portions of the Cu layer except the circuit pattern of the inner wire 2A were removed, and the mask 13 was then immersed in ethyleneglycol so as to be removed; thus, an inner wire 2A made of Cu was formed. Here, since the inner-layer-use and outer-layer-use green sheets 10A and 10B were to be immersed in a developing liquid in the etching process, base films were affixed to the rear surfaces of the inner-layer-use and outer-layer-use green sheets 10A and 10B so as not to make them directly contact the developing liquid.
Sample No. 21

In sample No. 21, after Cu foil had been formed on the inner-layer-use and outer-layer-use green sheets 10A and 10B in the same manner as sample No. 19, the resulting Cu foil was patterned by the photolithography method so that the inner and outer wires 2A and 2B were formed.

In other words, Cu foil having a thickness of 18 μm had been press-bonded onto the inner-layer-use and outer-layer-use green sheets 10A and 10B in the same manner as sample No. 19, masks 13 were formed by the photolithography method. With respect to the mask 13, a photosensitive resin that dissolves in ethyleneglycol was adopted. Thereafter, an etching process was carried out so as to remove unnecessary Cu foil except the inner and outer wires 2A and 2B, and the mask 13 was then immersed in ethyleneglycol so as to be separated; thus, inner and outer wires 2A and 2B were formed. In the present sample also, since the inner-layer-use and outer-layer-use green sheets 10A and 10B were to be immersed into a developing liquid in the etching process, base films were affixed to the rear surfaces of the inner-layer-use and outer-layer-use green sheets 10A and 10B so as not to make them directly contact the developing liquid. The other manufacturing processes were the same as those of sample No. 19.
Sample No. 22

In sample No. 22, after Cu foil had been formed on the inner-layer-use and outer-layer-use green sheets 10A and 10B in the same manner as sample No. 19, masks 13, made from glass paste containing an acrylic resin binder, was formed on the resulting Cu foil by the printing method. Then, an etching process was carried out so as to remove unnecessary Cu foil except the inner and outer wires 2A and 2B, and the inner-layer-use green sheet 10A, the outer-layer-use green sheet 10B and the binding sheet 4 were laminated. The masks 13 were allowed to remain thereafter without being removed. Here, the other manufacturing processes were the same as those of sample No. 19.
Sample No. 23

In sample No. 23, after Cu foil had been formed on the inner-layer-use and outer-layer-use green sheets 10A and 10B in the same manner as sample No. 19, masks 13, made from glass paste that melts in ethyleneglycol, was formed on the resulting Cu foil by the printing method. Then, this was subjected to an etching process so as to remove unnecessary Cu foil except the inner and outer wires 2A and 2B, and then immersed in ethyleneglycol so as to remove the masks 13; thus, inner and outer wires 2A and 2B were formed. Here, the other manufacturing processes were the same as those of sample No. 19.
Sample No. 24

In sample No. 24, after Cu foil had been formed on the inner-layer-use and outer-layer-use green sheets 10A and 10B in the same manner as sample No. 19, masks 13, made from alumina glass paste containing an acrylic resin binder that is the same material as that of the inner-layer-use and out-layer-use green sheets 10A and 10B, was formed on the resulting Cu foil by the printing method. Then, an etching process was carried out so as to remove unnecessary Cu foil except the inner and outer wires 2A and 2B, thereby forming inner and outer wires 2A and 2B. The masks 13 were allowed to remain thereafter without being removed. Here, the other manufacturing processes were the same as those of sample No. 19.
Sample No. 25

Sample No. 25, which serves as a comparative example of the present invention, was basically manufactured in the same manufacturing method as sample No. 22; however, it is different therefrom in that, with respect to its firing process, no binding sheet 4 was placed.

Sample No. 26

Sample No. 26, which serves as a comparative example of the present invention, was basically manufactured in a manufacturing method similar to sample No. 17; however, it is different therefrom in that the inner wire 2B was formed on the inner-layer-use green sheet 10A through the screen printing method by using Ag paste.

Sample No. 27,

Sample No. 27, which serves as a comparative example of the present invention, was basically manufactured in a manufacturing method similar to sample No. 19; however, it is different therefrom in that the inner wire 2B was formed the inner-layer-use green sheet 10A through the screen printing method by using Cu paste.

The external appearance and the cross-section of the respective samples 17 to 27 thus obtained were examined, and the connecting property between the inner wire 2A and the connection via 3 and the sheet resistivity of the outer wire 2B were measured by the four-terminal method through the via 3 inside the outer substrate layer 1B. Table 4 shows the results of the measurements.

process. In samples No. 17 to No. 20, the inner wire 2A was formed by the thin-film method or the plating method; and these methods achieved low electrical resistance with respect to the sheet resistivity in the inner wire 2A. Moreover, in samples No. 21 to No. 24 using Cu foil, a further reduced value of 1.5 m$\Omega$ was obtained in the resistivity. Furthermore, in these samples No. 21 to No. 24, the bonding property between the connection via 3 and the inner wire 2A and the interlayer gap between the inner wire 2A and the inner and outer substrate layers 1A, 1B, examined from the cross-section, were properly maintained without causing any problems.

In contrast, as shown by samples No. 26 and No. 27 serving as comparative examples, in the case when the inner wire 2A was formed by the screen printing method using a conductive paste, the sheet resistivity became slightly higher due to a glass component contained so as to melt and bond the inner wire 2A and the inner substrate layer 1A. Moreover, interlayer gaps tend to occur between the inner wire 2A and the inner substrate layer 1A.

As described above, with the method in which, after the formation of the inner wire 2A on the inner-layer-use green

TABLE 4

| Sample No. | Wiring layer | Wiring-layer forming method | Substrate state after after firing process | Sheet resistivity [m$\Omega$/□] | E/C |
|---|---|---|---|---|---|
| 17 | Ag | Vapor deposition method (Pattern film formation) | Good | 1.7 | E |
| 18 | Ag | Sputtering method (Pattern film formation) | Good | 1.7 | E |
| 19 | Cu | Plating method (Pattern film formation) | Good | 1.8 | E |
| 20 | Cu | Plating method (Film formation) + Photolithography method | Good | 1.8 | E |
| 21 | Cu foil | Photolithography method | Good | 1.5 | E |
| 22 | Cu foil | Printing method (Glass paste) (without mask removal) | Good (without removing mask) | 1.5 | E |
| 23 | Cu foil | Printing method (Glass paste) (Mask removal) | Good | 1.5 | E |
| 24 | Cu foil | Printing method (Substrate paste) (without mask removal) | Good | 1.5 | E |
| 25 | Cu foil (without binding sheet) | Printing method (Glass paste) (without mask removal) | Warpage and partial disconnection in wiring | disconnection in wiring | C |
| 26 | Ag paste (containing glass) | Screen printing method | Gaps between wiring and substrate | 2.4 | C |
| 27 | Cu paste (containing glass) | Screen printing method | Gaps between wiring and substrate | 2.3 | C |

Since only comparative sample No. 25 had a structure in which the laminated body of the inner-layer-use and outer-layer-use green sheets 10A and 10B was solely fired without using the binding sheet 4, shrinkage was forcefully exerted in the planar direction in the inner wire 2A, with the result that warpage and partial disconnection occurred therein. In contrast, with respect to the other samples, since the binding sheet 4 was provided, the in-plane shrinkage in the inner-layer-use and outer-layer-use green sheets 10A and 10B was maintained at not more than 0.1%, and none of disconnection, warpage, cracks, etc. occurred in the inner wire 2A formed on the inner-layer-use green sheet 10A. Moreover, the cross-section after the firing process showed that, except comparative example No. 25, the contacting property between the inner wire 2A and the inner and outer substrate layers 1A, 1B was properly maintained. This is because, different from paste, no component is included which releases gas at the time of the binder-eliminating sheet 10A, the inner wire 2A and the inner-layer-use and outer-layer-use green sheet 10A and 10B are simultaneously fired through the in-plane non-shrinkage process, it becomes possible to provide a superior inner wire 2A having a low resistivity.

Additionally, in sample No. 19, the inner wire 2A was formed by using Cu as the conductor component; and also in the case of a multi-layer wiring board that was formed by using Ag as the conductor component of the inner wire 2A and, except this, carrying out the same manufacturing processes as sample No. 19, it was confirmed that the same effects as those of sample No. 19 could be obtained.

APPLIED EXAMPLE 4

With respect to the metal component and the ceramics substrate material in the conductor material, those materials different from the materials used in applied examples 1 to 3 were tested and the effects were confirmed; and the results thereof are described as follows:

In the same methods as applied examples 1 to 3, inner-layer-use and outer-layer-use green sheets 10A and 10B, which used conductive paste made from Ag—Pd and had a substrate composition of Ba—Nd—Ti—O, were manufactured. The Ag—Pd paste was used as the via paste, and connection via 3 made from Ag—Pd were formed by the vapor deposition method.

Next, via holes having a diameter of 0.2 mm φ were formed by punching in the inner-layer-use and outer-layer-use green sheets 10A, 10B made of Ba—Nd—Ti—O at predetermined positions, and after the Ag—Pd paste had been injected into the via holes, land electrodes were formed on their surfaces on demand. The land electrodes were formed by using wiring paste.

Next, an Ag—Pd vapor deposition process was carried out at predetermined positions of the inner-layer-use and outer-layer-use green sheets 10A, 10B by using a mask for the vapor deposition that corresponds to the sheet resistance measuring wiring pattern 21 shown in FIG. 6 so that inner and outer wires 2A and 2B were formed. The inner and outer wires 2A and 2B were formed so that the positions of both ends were coincident with the positions of the connection via 3. Thereafter, the inner-layer-use and outer-layer-use green sheets 10A and 10B having the connection via 3 were laminated in a manner so as to make the positions of both sides of the inner and outer wires 2A and 2B and the positions of the respective connection via 3 coincident with each other; thus, a green sheet laminated body was formed.

Next, binding sheets 4 made from MgO powder were formed by using the same binder and plasticizer as the inner-layer-use and outer-layer-use green sheets 10A and 10B, and these binding sheets 4 were thermally press-bonded on the green sheet laminated body in a sandwiching manner.

The resulting laminated body was subjected to a binder-eliminating process in the air inside a heater at 600° C., and the firing process was carried out in a nitrogen atmosphere at 1200° C. for a maintaining period of 1 hour. After the firing process, the binding sheets 4 adhering to the two surfaces of the sintered body were removed by washing; thus, a multi-layer wiring board was obtained.

The external appearance and the cross-section of the resulting multi-layer wiring substrate were examined and the sheet resistivity of the inner layer 2A was measured through the exposed connection via 3 on the surface by means of the four-terminal method. The sheet resistivity was 10 mΩ/□, which was virtually the same as a value calculated from the conductor resistivity of the Ag—Pd composition used therein. It is confirmed from the observation of its cross-section that the bonding property between the Ag-Pd foil and the substrate was properly maintained. The results show that even when those materials different from the materials used in applied examples 1 to 3 are adopted, the same effects are obtained.

As clearly shown by the above description, the present invention makes it possible to provide a method for manufacturing a double-sided wiring board and a multi-layer wiring substrate that have wiring with a low resistivity as well as fine lines. Moreover, since the wiring is formed on a green sheet by using etching such as a photolithography method without using a transferring process, it is possible to obtain wiring that is free from defective patterns. Moreover, it is possible to omit the mask separation process by selecting the mask material, and consequently to simplify the processes.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A green sheet comprising:

a ceramic powder and a binder, the binder containing at least two resins wherein one resin is an acrylic resin having no polar group and in an amount not less than 10% by weight and not more than 50% by weight, and wherein the polar group is a carboxylic or hydroxyl group.

2. The green sheet according to claim 1, wherein the binder contains a methacrylic-acid-basedacrylic resin as a main component.

3. The green sheet according to claim 1, wherein a conductor layer made of a conductor virtually having no voids is further formed on a surface of the shoot.

4. The green sheet according to claim 3, wherein the conductor layer is made of metal foil.

5. The green sheet according to claim 4, wherein the conductor layer is made of metal foil that has been subjected to a roughening process on a surface thereof.

6. The green sheet according to claim 3, wherein a mask containing an inorganic composition that has virtually no sintering shrinkage at the firing temperature of the green sheet as a main component thereof is placed on the conductor layer.

7. The green sheet according to claim 1, further comprising:

connection via, used fur interlayer connection, that is formed inside the sheet in a thickness direction thereof.

8. A green sheet comprising:

a ceramic powder and a binder, the binder containing between about 10 weight % to about 50 weight % of an acrylic resin having no polar group, wherein the polar group is a carboxylic acid or hydroxyl group.

* * * * *

UNITED STATES PATENT AND TRADEMARK OFFICE
CERTIFICATE OF CORRECTION

| | | |
|---|---|---|
| PATENT NO. | : 6,696,139 B2 | Page 1 of 1 |
| DATED | : February 24, 2004 | |
| INVENTOR(S) | : Yasuhiro Sugaya et al. | |

It is certified that error appears in the above-identified patent and that said Letters Patent is hereby corrected as shown below:

<u>Column 30,</u>
Line 33, change "shoot" to -- sheet --

Signed and Sealed this

Twenty-third Day of November, 2004

JON W. DUDAS
*Director of the United States Patent and Trademark Office*